(12) United States Patent
Breuer et al.

(10) Patent No.: US 10,340,229 B2
(45) Date of Patent: Jul. 2, 2019

(54) SEMICONDUCTOR DEVICE WITH SUPERIOR CRACK RESISTIVITY IN THE METALLIZATION SYSTEM

(71) Applicant: GLOBALFOUNDRIES Inc., Grand Cayman (KY)

(72) Inventors: Dirk Breuer, Dresden (DE); Georg Talut, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 56 days.

(21) Appl. No.: 15/729,774

(22) Filed: Oct. 11, 2017

(65) Prior Publication Data

US 2019/0109097 A1     Apr. 11, 2019

(51) Int. Cl.
| | | |
|---|---|---|
| *H01L 23/528* | (2006.01) | |
| *H01L 23/532* | (2006.01) | |
| *H01L 21/768* | (2006.01) | |
| *H01L 23/00* | (2006.01) | |

(52) U.S. Cl.
CPC ...... *H01L 23/562* (2013.01); *H01L 21/76895* (2013.01); *H01L 23/5283* (2013.01); *H01L 23/53228* (2013.01); *H01L 24/03* (2013.01); *H01L 24/05* (2013.01); *H01L 2224/04042* (2013.01); *H01L 2224/05017* (2013.01); *H01L 2224/05025* (2013.01); *H01L 2224/05124* (2013.01); *H01L 2924/3512* (2013.01)

(58) Field of Classification Search
None
See application file for complete search history.

(56) References Cited

U.S. PATENT DOCUMENTS

| | | | |
|---|---|---|---|
| 8,860,224 B2 | 10/2014 | Chen et al. | |
| 2006/0267198 A1* | 11/2006 | Lin | H01L 23/5283 257/750 |
| 2012/0282753 A1* | 11/2012 | Kim | H01L 23/5223 438/396 |
| 2013/0256906 A1* | 10/2013 | Mori | H01L 23/5384 257/774 |
| 2013/0320522 A1 | 12/2013 | Lai et al. | |
| 2015/0061156 A1 | 3/2015 | Jiang et al. | |

* cited by examiner

*Primary Examiner* — Nishath Yasmeen
(74) *Attorney, Agent, or Firm* — Amerson Law Firm, PLLC (57) ABSTRACT

A semiconductor device comprises non-quadrangular metal regions in the last metallization layer and/or non-quadrangular contact pads, wherein, in some illustrative embodiments, an interdigitating lateral configuration may be obtained and/or an overlap of the contact pads with underlying metal regions may be provided. Consequently, mechanical robustness of the contact pads and the passivation material under the underlying interlayer dielectric material may be increased, thereby suppressing crack formation and crack propagation.

20 Claims, 6 Drawing Sheets

SEMICONDUCTOR DEVICE WITH SUPERIOR CRACK RESISTIVITY IN THE METALLIZATION SYSTEM

BACKGROUND

1. Field of the Disclosure

Generally, the present disclosure relates to the technology of semiconductor devices including metallization systems and a pad structure for connecting to a package.

2. Description of the Related Art

Semiconductor devices typically include, depending on the degree of complexity, a more or less number of semiconductor-based circuit elements, such as field effect transistors, bipolar transistors and the like, typically in combination with resistors, capacitors and the like. In most approaches, these circuit elements may be formed in and on a corresponding semiconductor layer, such as a silicon layer, a silicon/germanium layer or any other appropriate semiconductor material layer, wherein, layer after layer, respective device patterns may be formed and/or processed in accordance with a specified design and related design rules by using well-established, yet sophisticated, manufacturing techniques, such as photolithography, etching, ion implantation and the like. Depending on the overall complexity of the semiconductor device under consideration, a relatively high number of process steps may be necessary so as to complete a functional device. For example, in the so-called "front end of line" (FEOL), respective process steps are performed in order to complete the actual semiconductor-based circuit elements, such as transistors and the like, wherein, in sophisticated applications, transistor elements of critical dimensions of 30 nm and less may be manufactured, thereby providing the potential for implementing a very large number of circuit elements and, thus, configuring entire systems in a single chip. Thereafter, the previously formed semiconductor-based circuit elements, such as transistors, resistors and the like, may be passivated and may be particularly interconnected with each other by providing so-called contact elements, which may be formed in appropriate dielectric material(s) formed so as to reliably cover the previously fabricated circuit elements.

Next, a metallization system has to be formed by providing appropriate dielectric materials and forming therein metal and contact vias, thereby providing "a fabric" of highly conductive metal-containing connections, similar to a multilevel printed circuit board, in order to establish the required electrical connections for obtaining the desired functional behavior. Generally, in complex metallization systems, two or more metallization levels may have to be implemented in order to provide the required number of electrical connections between the individual circuit elements, since, typically, the number of required connections increases over-proportionally with respect to the number of circuit elements implemented in the device level.

Furthermore, since the electrical connections in the metallization system may have a significant influence on the overall performance of the completed semiconductor device, sophisticated materials and techniques have been developed in order to form highly conductive metal lines and vias with reduced lateral dimensions, yet high performance, thereby typically requiring the incorporation of highly conductive metals, such as copper, copper alloy and the like, in combination with appropriately designed materials, such as so-called low-k dielectric materials having a dielectric constant of 3.7 and lower. Consequently, in many cases, the resulting metallization system represents a complex stack of metallization layers, at least some of which may be formed on the basis of critical materials suffering from less pronounced mechanical stability compared to conventional dielectric materials, such as silicon dioxide, silicon nitride and the like. Consequently, when encountering certain loads during the further processing or during operation of such semiconductor devices, including respective metallization systems, yield loss and/or premature failure of semiconductor devices may be observed, which may be frequently caused by cracks forming in sensitive dielectric materials, which may not only result in a reduction of mechanical stability, but may also impart less electrical strength to respective portions of the metallization system.

Frequently, substantial mechanical stress may be introduced into the sensitive metallization system by interaction with a final layer or passivation level connecting to and passivating the metallization system, which may comprise an appropriate passivation material providing the required robustness with respect to environmental conditions and the like, and which may also have formed therein respective contact pads that may serve for connecting the semiconductor device under consideration to other components, such as a package, any other appropriate carrier material, other semiconductor devices so as to form three-dimensional chip configurations, and the like. That is, the arrangement of respective contact pads is designed so as to provide communication to the outside world with respect to mechanical, electrical and thermal interaction with the environment. For example, one frequent approach for providing communication of the semiconductor device with the environment is the incorporation of the semiconductor chip into a package and providing electrical contact to the package or pins thereof by means of wire bonding, in which appropriate metallic wires, such as copper wires and the like may be connected to the respective contact pads, also referred to as bond pads, by applying pressure and heat. For example, wire bonding has become a very established and economic technology for semiconductor devices in which, irrespective of the internal complexity, a relatively restricted number of contacts to the environment is required.

In other contact technologies, an electrical and mechanical contact between the semiconductor device and a carrier or package substrate may be established by soldering techniques in which respective solder bumps may be provided in at least one of the package substrates and the semiconductor device, while the actual connection may be established on the basis of a soldering process. Also, in this case, significant mechanical stress may be induced in the passivation level of the semiconductor device, which may comprise polyimide and the like, having superior passivation characteristics, yet exhibiting a relatively brittle behavior when exposed to mechanical stress. Consequently, in the arrangement of respective contact pads, which may be frequently formed of aluminum, stress may be created, for instance, in the form of tensile stress, frequently promoted by the significant difference of the coefficients of thermal expansion between the aluminum contact pads and the surrounding passivating dielectric material. Respective cracks may then propagate under the influence of the tensile stress and may reach deeper lying metallization layers, in particular when sophisticated dielectric materials may have been used therein. As discussed above, any such crack-related defects in the metallization system may result in yield loss, premature failure or reduced reliability of the semiconductor device under consideration.

In many approaches, the respective contact pads may have to be placed with tight spacing in the passivation level so as to comply with design criteria such that, for instance, providing respective bond pads as substantially "isolated" structures for enhancing mechanical robustness may not represent a viable option. In other cases, in addition to contact pads, relatively thick metal lines, for instance for RF applications, may have to be frequently implemented, thereby exacerbating the problem of crack formation in the passivation layer and underlying metallization layers even further.

For example, U.S. Pat. No. 8,860,224 discloses a semiconductor device wherein an ultra-thick metal (UTM) line is formed over the top metal layer, wherein a passivation material is formed so as to exhibit a specific thickness compared to the metal layer in an attempt to reduce metallization failures.

U.S. Patent Publication No. 2013/0320522 discloses a semiconductor device with a contact pad formed over a substrate, wherein a via in a first passivation layer is formed so as to connect the contact pad to a metal region of the last metallization layer on the basis of a specifically designed via geometry.

U.S. Patent Publication No. 2015/0061156 discloses a manufacturing technique for forming a bond pad, for instance, for wire bonding, by reducing the number of dielectric layers in the passivation level of the semiconductor device, however, without specifically addressing the problem of crack formation in the passivation material and the metallization layers positioned below the passivation layer.

In view of the situation described above, the present disclosure, therefore, relates to semiconductor devices and manufacturing techniques in which contact pads, such as bond pads and the like, may be formed in a passivating material, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In order to reduce the probability of crack formation and propagation, the present disclosure is based on the concept that appropriate design of adjacent contact pads and/or adjacent underlying metal regions to which the contact pads have to be connected may enable a configuration which may inherently reduce the probability of crack formation and, in particular, crack propagation. That is, according to the principles of the present disclosure, a certain degree of lateral interdigitating of adjacent connect pads or metal regions of the very last metallization layer and/or a specific overlap of a contact pad with two underlying metal regions may result in a more mechanically robust construction and may additionally result in a certain degree of compressive stress, thereby reducing the tendency of forming cracks, even upon being subjected to external stress components, for instance, during wire bonding, soldering, thermal cycles during fabrication and usage of the semiconductor device and the like. Furthermore, by providing a compressive stress-promoting overall lateral design of the metal regions of the very last metallization layer and/or the contact pads, a propagation of cracks, which may, nevertheless, form to a certain degree, may be efficiently suppressed.

In one illustrative embodiment disclosed herein, a semiconductor device is provided. The semiconductor device includes a metallization system including a last metallization layer, which comprises a first metal region and a second metal region, wherein the second metal region is laterally separated from and adjacent to the first metal region. The semiconductor device further includes a passivation layer formed above the last metallization layer. Furthermore, a first contact pad is formed in the passivation layer so as to be in contact with the first metal region. Additionally, the semiconductor device includes a second contact pad formed in the passivation layer adjacent to the first contact pad so as to be in contact with the second metal region and overlap a portion of the first metal region.

According to another illustrative embodiment disclosed herein, a semiconductor device is provided. The semiconductor device includes a metallization system including a last metallization layer, which comprises a first metal region and a second metal region that is laterally separated from and adjacent to the first metal region. Furthermore, the semiconductor device includes a passivation layer formed above the last metallization layer. Additionally, the semiconductor device includes a first contact pad formed in the passivation layer so as to be in contact with the first metal region. Moreover, the semiconductor device includes a second contact pad formed in the passivation layer adjacent to the first contact pad so as to be in contact with the second metal region, wherein the first metal region and/or the first contact pad has a non-quadrangular lateral shape.

According to a still further embodiment disclosed herein, a method is provided. The method includes forming a first metal region and a second metal region in a dielectric material of a last metallization layer of a metallization system of a semiconductor device, the first and second metal regions adapted to be connected to different electric potentials, and forming first and second contact pads in a passivation layer, wherein the first and second contact pads are conductively coupled to the first and second metal regions, and wherein the first contact pad overlaps with the second metal region.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Figure 1A:
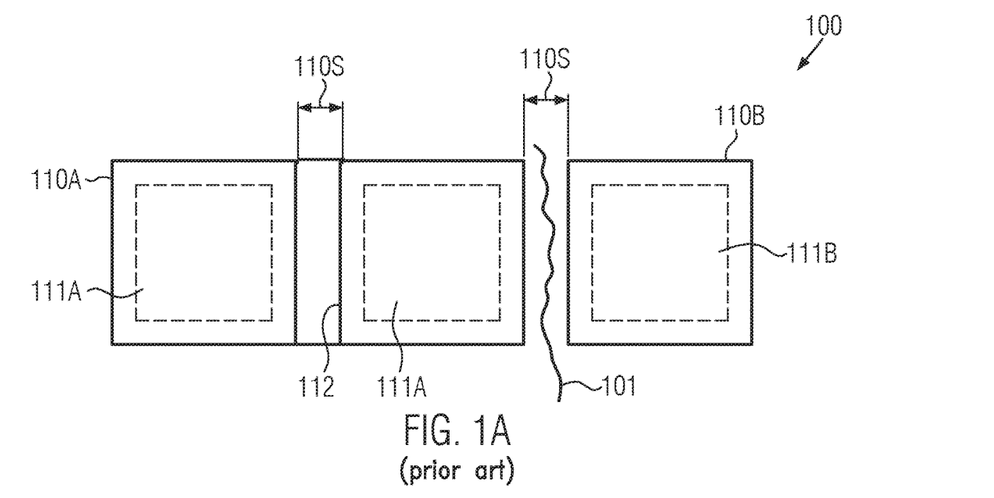
FIGS. 1A and 1B schematically illustrate a top view and a cross-sectional view, respectively, of a semiconductor device, including a metallization system and a passivation layer, including contact pads, in accordance with a conventional design which is believed to promote crack formation, in particular, in the dielectric material formed below the passivation material.
Figure 1B:
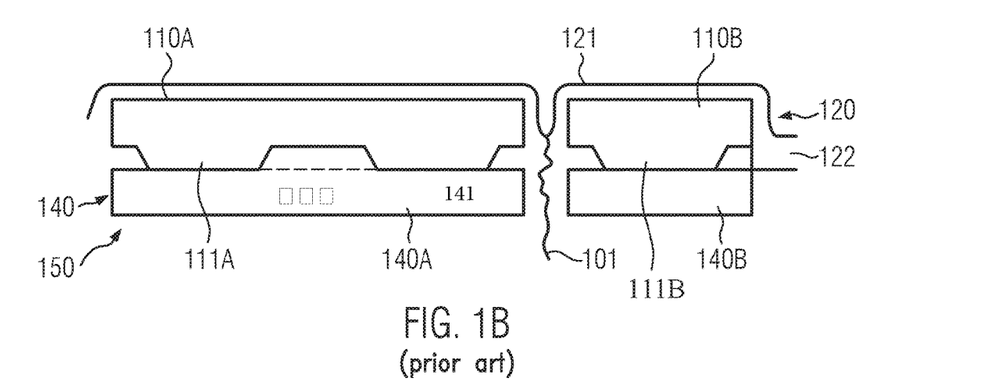

The principles of the present disclosure are based, among other things, on certain observations associated with crack-related failures of semiconductor devices in which, in particular in tightly spaced contact pad arrangements, a significantly reduced mechanical robustness may be encountered, which may result in the formation of cracks and the propagation of any such cracks into the deeper lying sensitive dielectric materials, thereby resulting in premature device failure or in pronounced yield loss when a crack formation is induced during the overall manufacturing process, for instance, upon contacting the contact pads with appropriate bond wires, solder bumps and the like. With reference to FIGS. 1A and 1B, a basic configuration of a semiconductor device and its last metallization layer and passivation layer will be described.

FIG. 1A schematically illustrates a top view of a semiconductor device 100 or its geometric configuration, also referred to as circuit design or simply design, in order to provide a desired structure of contact pads, which may be used as contact pads for wire bonding and the like. As illustrated, first contact pads 110A, having a substantially quadrangular shape in the top view, may be provided with a specific device and design-dependent lateral spacing 110S in accordance with overall design criteria. Furthermore, a second contact pad 110B may be provided with substantially the same size and shape as the first connect pads 110A and also substantially the same spacing 110S may be used in order to obtain a desired array of the contact pads 110A, 110B in accordance with the design requirements. It should be appreciated that a plurality of such contact pads 110A, 110B may typically have to be provided on top of a respective metallization system (not shown) in order to provide the required connectivity to a package, a carrier substrate and the like. The contact pads 110A may represent contact pads connected to a same electrical potential and may, thus, be connected to the same metal region (not shown) of the last metallization layer. On the other hand, the contact pad 110B may represent a contact pad to be connected to a different electric potential, thereby requiring connection to a different metal region (not shown) in the last metallization layer. Furthermore, a respective "via" structure may be shown in dashed lines, which may represent respective metal contacts so as to connect to underlying metal regions of the last metallization layer. For example, respective vias 111A may be used for the first contact pads 110A, while a respective via 111B may provide the connection of the second contact pad 110B to the underlying metallization system.

Generally, the contact pads 110A, 110B and the respective vias 111A, 111B may be formed of the same material, for instance, aluminum, which is a frequently used and well-established material for providing via bond pads, additional metal lines for RF applications and the like. Moreover, the lateral dimensions are a matter of design rules, but may, however, include minimum dimensions that are by far less critical than respective minimum dimensions in overlying metallization layers. As illustrated, in one embodiment, the outer shape in top view of the contact pads 110A, 110B and of the vias 111A, 111B may represent a square with substantially linear edge regions 112.

Furthermore, the contact pads 110A, 110B may be laterally embedded in an appropriate passivation material, such as polyamide and the like, which, for the sake of simplification, is not shown. Furthermore, the passivation material may overlap a portion of the contact pads 110A, 110B in order to expose appropriate contact surface areas, for instance, for via bonding and the like. The vias 111A, 111B may, on the other hand, be laterally embedded in any appropriate interlayer dielectric material, such as hydrogen-enriched silicon dioxide, silicon dioxide and the like.

The inventors have recognized that a crack 101 may frequently form in the passivation material and/or the underlying interlayer dielectric material, preferably in the spacing 110S between the first and second contact pads 110A, 110B connected to different metal regions, while, on the other hand, respective cracks may be rarely encountered in the spacing 110S between the first contact pads 110A. Such crack formation may occur upon additional mechanical stress, for instance, when performing a via bonding process in which mechanical force and heat may be applied, while, in other cases, simply temperature cycling may result in additional significant stressed components, for instance, due to a difference in the coefficients of thermal expansion of the material of the contact pads 110A, 110B and the surrounding dielectric materials.

FIG. 1B schematically illustrates a cross-sectional view of the semiconductor device 100. As illustrated, a metallization system 150 may be provided, which, for convenience, is illustrated on the basis of a very last metallization layer 140 that includes an appropriate dielectric material 141 and a first metal region 140A and a second metal region 140B, which are embedded in the dielectric material 141. It should be appreciated that, depending on the overall complexity of the semiconductor device 100, the metallization system 150 may have two, three, four, five or more metallization layers so as to implement the required connectivity for any circuit elements formed in the semiconductor device 100, as already previously discussed. As illustrated, the contact pads 110A may be connected by means of the vias 111A to the first metal region 140A, when the contact pads 110A have to be connected to the same electrical potential. On the other hand, the contact pad 110B may be connected to the metal region 140B by means of the via 111B in order to connect the contact pad 110B with a specific electric potential. Hence, there is no mechanical connection between the first and second metal regions 140A, 140B except for the dielectric material 141.

Moreover, as discussed above, the contact pads 110A, 110B in combination with the vias 111A, 111B may form a passivation layer or level 120, which may represent the very last device level of the semiconductor device 100 and may also provide the required passivation of the semiconductor device 100, except for respective openings for exposing a central area of the contact pads 110A, 110B. For example, the cross-section of FIG. 1B may be taken at an edge area of the first and second contact pads 110A, 110B so that the passivation material 121 may be illustrated as a continuous layer formed above the respective portions of the contact pads 110A, 110B and may also reliably cover the spacing 110S. As discussed above, the dielectric material 122 may laterally surround the vias 111A, 111B, which may represent lower portions of the contact pads 110A, 110B, and may be formed of the same material on the basis of any appropriate deposition technique, such as plating and the like. Typically, the dielectric material 122, also referred to as interlayer dielectric material, may differ from the material composition of the passivation material 121. Similarly, the dielectric material or interlayer dielectric material 141 of the last metallization layer 140 may also differ in composition from the passivation material 121.

As is evident from FIGS. 1A and 1B, upon creating the crack 101 due to mechanical stress and the like, and due to the design in which the metal region 140A may have substantially the same lateral dimension as the combined first connect pads 110A, and the contact pad 110B may have basically the same dimension as the underlying metal region 140B, the propagation of the crack 101 into the lower-lying dielectric materials may be promoted, for instance, due to a generally tensile stress in this material and, in particular, due to a path of reduced mechanical robustness formed by the dielectric materials 122, 141 within the spacing 110S. On the other hand, due to a significant overlap of the first contact pads 110A with the underlying metal region 140A, a respective crack formation in the sensitive dielectric materials 122, 141 between the first contact pads may substantially not be observed.

Consequently, the inventors have recognized that, by a redesign of the pad arrangement and/or the arrangement of the metal regions in the very last metallization layer, without affecting the functional behavior and without significantly changing position and total size of these components, a significant increase of mechanical robustness of the sensitive materials 122, 141 may be achieved. To this end, the design of the semiconductor device 100 may be modified so as to provide a crack-suppressing design, which may be accomplished by providing an interdigitating and/or overlapping configuration, as will be described later on in more detail.

Figure 2A:
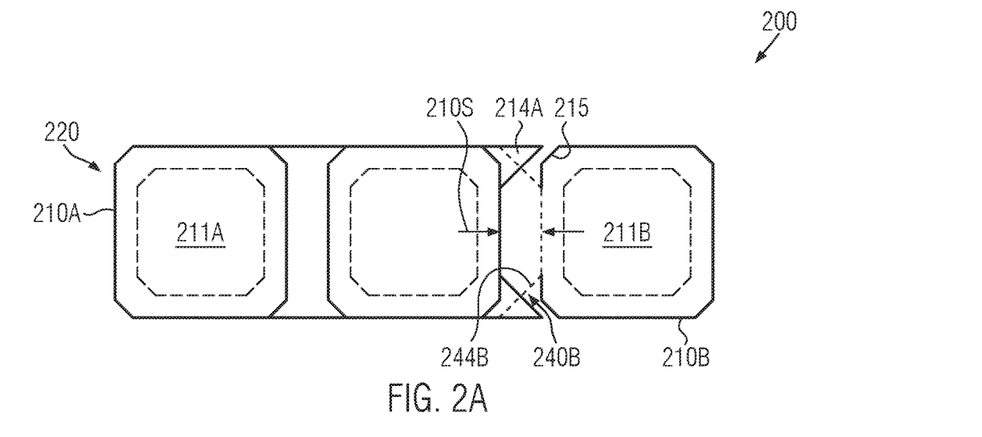
FIGS. 2A and 2B schematically illustrate a top view and a cross-sectional view, respectively, of a semiconductor device and a corresponding design of contact pads and metal regions of a last metallization layer so as to provide overlapped portions for strengthening the mechanical robustness of, in particular, a brittle interlayer dielectric material used in the last metallization layer and below, according to illustrative embodiments.

FIG. 2A schematically illustrates a top view of a semiconductor device 200, which may be of similar configuration as the device 100 of FIGS. 1A and 1B in that, for convenience, it may be assumed that the semiconductor device 200 may have the same basic configuration and function as the semiconductor device 100, yet providing a crack-suppressing configuration in the passivation level and the metallization system as discussed above.

As illustrated, the semiconductor device 200 may comprise a passivation level or layer 220, a part of which may represent a passivation material (not shown) and respective contact pads, such as first contact pads 210A and a second contact pad 210B. Basically, the contact pads 210A, 210B may substantially occupy the same area as the configuration shown and described in the context of the semiconductor device 100, wherein the same connectivity and functionality may also be provided. Contrary to the previously-described configuration, in which substantially square-like contact pads may be provided, the design and, thus, the lateral shape, i.e., the shape in a top view as illustrated in FIG. 2A, may be modified so as to provide enhanced mechanical robustness. To this end, the shape of at least one of the first connect pads 210A, that is, the contact pad 210A adjacent to the second contact pad 210B, may be modified so as to represent a non-quadrangular lateral shape in order to increase mechanical robustness by, in one illustrative embodiment, providing a certain overlap between the contact pad 210A adjacent to the contact pad 210B and a metal region 240B positioned below the contact pad 210B.

For example, one or more projections 214A (e.g., basically substantially triangular shaped projections), for instance, at respective corner portions of the respective contact pad 210A, may be provided in order to "bridge" a portion of a corresponding basic spacing 210S. At the same time, the metal region 240B may have oppositely positioned projections 244B (e.g., basically substantially triangular shaped projections) so that an overlap of these "vertically" stacked components in the top view of FIG. 2A may be obtained between the region 240B, representing the corresponding metal region in the last metallization layer for connecting to the contact pad 210B, and the contact pad 210A that is connected to a further metal region (not shown) provided in the last metallization layer in order to obtain the same connectivity and functional behavior as described in the context of the semiconductor device 100 in FIGS. 1A and 1B.

Furthermore, as illustrated, the projections 214A may be complementary in size and shape with respect to corner portions 215 of the contact pad 210B in order to provide a desired lateral distance between the first and second contact pads 210A, 210B. The term "complementary" is to be understood to mean that, in top view, opposing edge portions of respective components, such as the projections 214A and oppositely positioned corners 215, have a geometric configuration such that a substantially constant lateral spacing may be preserved. Consequently, the degree of "corner rounding" at the corners 215 may be obtained by cutting out a respective triangular portion that has a line parallel to a respective line of the triangular projection 214A. Consequently, the non-quadrangular lateral shape of the first and second contact pads 210A, 210B may be achieved by a complementary geometric configuration of opposing edges of these contact pads, wherein at least one of the edges comprises respective projections, such as the triangular projections 214A.

It should be appreciated that the second contact pad 210B may also have respective projections (not shown) at an opposite side when additional contact pads may have to be provided at the right hand side of the contact pad 210B. Consequently, by appropriately designing edges of adjacent contact pads intended to connect to different electric potentials and by appropriately designing the underlying metal regions in the very last metallization layer, an overlap of the vertically stacked portions may be obtained, thereby providing superior crack-suppressing characteristics. In this context, it should be appreciated that the term "overlap" is to be understood to describe a same lateral position, at a different height level, of a portion of a first component and a portion of a second component that is formed above or below a first component. In this respect, the contact pad 210A positioned laterally adjacent to the contact pad 210B overlaps the metal region 240B, since at least a portion of the projection 214A of the contact pad 210A has the same lateral position as the projection 244B of the underlying metal region 240B.

Figure 2B:
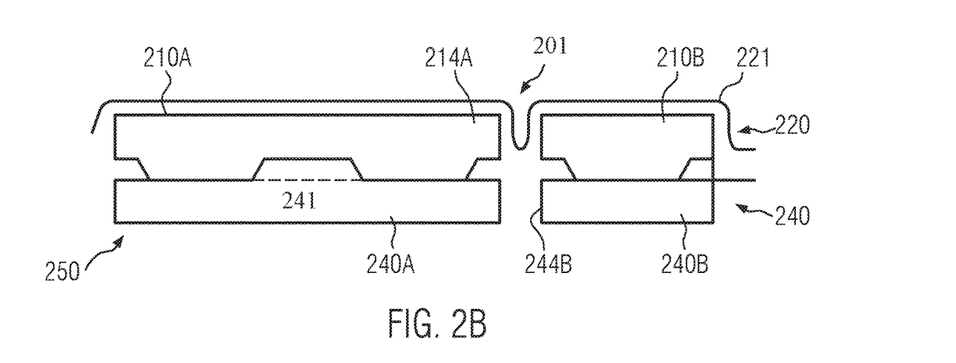

FIG. 2B schematically illustrates a cross-sectional view of the device 200 of FIG. 2A. As illustrated, a metallization system 250, including one or more metallization layers, of which, for convenience, only the last metallization layer 240 is illustrated, may be provided in accordance with overall device requirements, as is also discussed above. The last metallization layer 240 may comprise a dielectric material 241 in which metal regions 240A and the metal region 240B may be embedded, as is also described above in the context of the semiconductor device 100. As explained with reference to FIG. 2A, the metal regions 240A and 240B may represent different electrical potentials, which conventionally results in a corresponding spacing of the metal regions 240A, 240B and the respective contact pads of reduced stability, as discussed above in the context of FIGS. 1A and 1B. Due to the modified design of the semiconductor device 200, the metal region 240B may comprise the projection 244B so as to provide an overlap with the adjacent contact pad 210A due to the provision of the projection 214A. Consequently, a respective crack propagation of a crack 201 formed in a passivation material 221 may be restricted along a depth direction so as to not further propagate into the depth of the metallization system 250 by means of the projection 244B of the metal region 240B.

Again referring to FIG. 2A, it is evident that a lateral restriction for crack propagation, for instance, as provided by projections 214A in the passivation level and projections 244B in the last metallization layer 240 and also a restriction for crack propagation along a depth direction due to the overlapping projections 214A, 244B, may be accomplished, thereby significantly reducing the probability of crack propagation along any direction in the metallization system 250.

Consequently, enhanced mechanical performance of the metallization system 250 and the passivation level 220 may be accomplished by using an appropriately adapted device design, without requiring significant changes in overall device configuration and without redesigning respective manufacturing processes, except for providing appropriately designed lithography masks so as to transfer the modified design of non-quadrangular lateral shape of the metal regions and/or of the contact pads into the actual semiconductor device. In this respect, it should be noted that the more complex edge geometry of the metal regions 240A, 240B and/or the contact pads 210A, 210B in comparison to the conventional design (FIGS. 1A and 1B) may be readily accomplished on the basis of well-established lithography techniques, since, as discussed above, typically any minimum dimensions in the passivation level 220 and the last metallization layer 240 may be significantly greater compared to critical dimensions in lower lying metallization layers, so that a more complex design of the edge region may be well within the capabilities of well-established lithography techniques.

When seen from another point of view, the embodiment as illustrated in FIGS. 2A and 2B of the design or semiconductor device 200 may represent a laterally interdigitating configuration, wherein the interdigitating nature in this embodiment is accomplished in at least two levels, that is, in the uppermost level of the contact pads 210A, 210B and in a lower lying level defined by the regions 240A, 240B. The interdigitating configuration of the contact pads 210A, 210B is obtained by the complementary lateral shape or design of the respective laterally oppositely arranged edges, which are formed for the contact pad 210A by the illustrative triangular projections 214A and for the contact pad 210B by the corresponding corner portions 215 imparting a polygonal geometry to this part of the contact pad 210B. A similar complementary or interdigitating configuration is obtained at the level of the metal regions 240A, 240B.

Figure 2C:
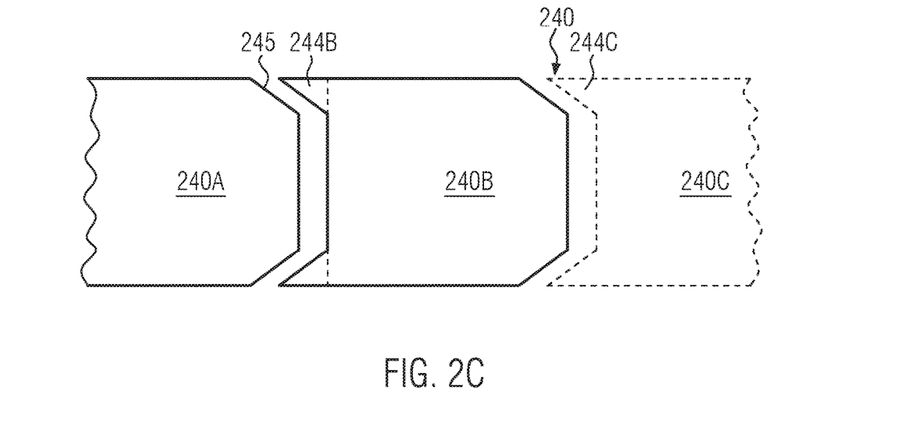
FIG. 2C schematically illustrates a top view of the last metallization layer of the semiconductor device of FIGS. 2A and 2B.

FIG. 2C schematically illustrates a top view of the metallization layer 240, including the metal regions 240A, 240B. In this case, the laterally oppositely arranged edges of the metal regions 240A, 240B have an interdigitating lateral configuration defined by the substantially triangular projections 244B and the complementary "rounded" corners 245 provided at the edge of the metal region 240A. In addition, these complementary or interdigitating lateral configurations, which per se impart lateral crack-suppressing behavior to any interlayer dielectric material provided between the metal regions 240A, 240B, may be overlapped, as explained with reference to FIGS. 2A and 2B, which may be accomplished by overlap of the projections 244B of the metal region 240B with the projections 214A of the contact pad 210A, as shown in FIGS. 2A and 2B.

Furthermore, as previously discussed, a similar interdigitating or complementary lateral configuration may also be established for any further neighboring metal regions, such as the region 240C positioned adjacent to the metal region 240B. Consequently, respective projections 244C of the metal region 240C may correspond in a complementary manner to "rounded", i.e., polygonal, corners 245 of the metal region 240B.

It should be appreciated that a similar configuration may also be continued in the level of the contact pads so as to provide a plurality of chained contact pads having lateral interdigitating geometry and overlapping with the underlying chain of metal regions, such as the regions 240A, 240B, 240C.

It is to be noted that a lateral shape of the respective vias 211A, 211B may also be appropriately adapted so as to comply with the lateral shape of the contact pads 210A, 210B, for instance, by providing the vias 211A, 211B with the respective polygonal shape obtained by the "rounded" corner portions.

Figure 3A:
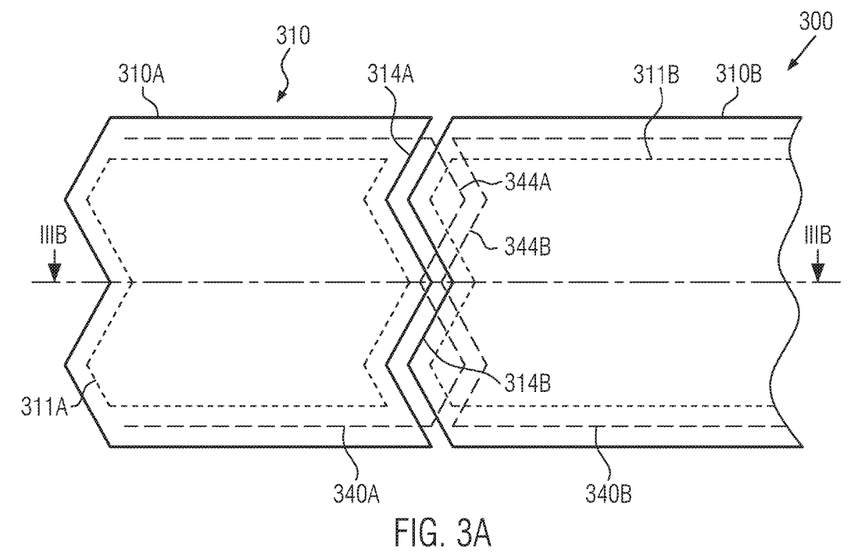
FIGS. 3A and 3B schematically illustrate a top view and a cross-sectional view, respectively, of a design and a corresponding semiconductor device in which overlapped portions may be achieved on the basis of an "interdigitating" configuration of opposed edge regions of contact pads and/or metal regions, according to further illustrative embodiments.

FIG. 3A schematically illustrates further illustrative embodiments of a semiconductor device or design thereof 300 in a top view with adjacent contact pads 310A, 310B and underlying metal regions 340A, 340B. As is evident from FIG. 3A, an interdigitating lateral configuration is obtained at least at the level of the contact pads 310A, 310B, wherein respective laterally opposing edges of the contact pads 310A, 310B may be formed by corresponding projections 314A, 314B, respectively, thereby forming a zigzag edge geometry of complementary configuration in the contact pads 310A, 310B. Similarly, the underlying metal regions 340A, 340B may have laterally oppositely arranged edges with interdigitating configuration obtained by corresponding projections, in this case, of substantially triangular geometry, 344A, 344B, respectively, thereby also forming a substantially zigzagging boundary or spacing between the metal regions 340A, 340B. Furthermore, as also discussed above with reference to FIGS. 2A-2C, an overlap between the contact pads 310A, 310B and the underlying metal regions 340A, 340B may be accomplished, since the projections 344A of the metal region 340A may overlap with the projections 314B of the contact pad 310B and the projections 344B of the metal region 340B may overlap with the projections 314A of the contact pad 310A. Consequently, an interdigitating configuration is obtained in the lateral direction, i.e., the horizontal and vertical directions in FIG. 3A, while an overlapping configuration is obtained in the height direction, i.e., in a direction perpendicular to the drawing plane of FIG. 3A. In this manner, the crack-suppressing performance may be even further enhanced, since crack propagation may be suppressed in the lateral and height directions in a highly efficient manner. It should be appreciated that, in some illustrative embodiments, respective vias 311A, 311B, providing for electrical and mechanical contact between the contact pads 310A and the metal region 340A and the contact pad 310B and the metal region 340B, respectively, may also have a lateral shape that substantially resembles the lateral shape of the corresponding contact pads 310A, 310B, thereby also forming a complementary configuration at laterally oppositely arranged edges and avoiding any pronounced reduction in surface area of the vias 311A, 311B, while still providing a desired cross-sectional shape, i.e., a tapered shape, as will be discussed later on with reference to FIG. 3B.

Figure 3B:
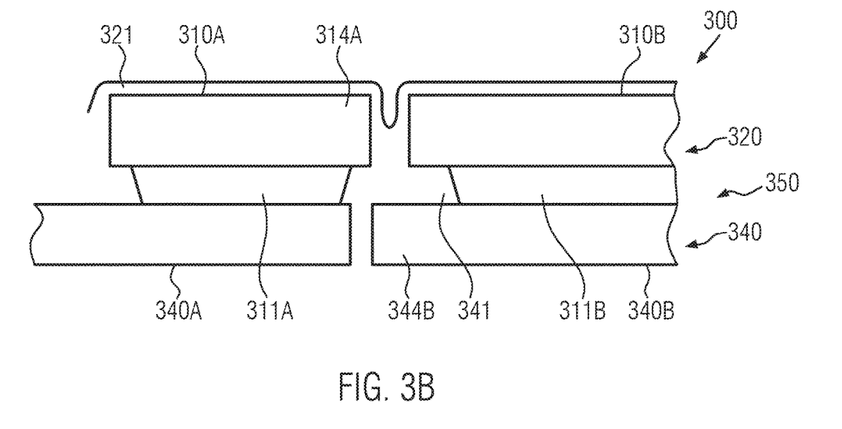

FIG. 3B schematically illustrates a cross-sectional view taken along the line IIIB-IIIB of FIG. 3A. As illustrated, the semiconductor device 300, including the contact pads 310A, 310B provided in the passivation level 320, also comprises a passivation material 321. Furthermore, the metal regions 340A, 340B may represent the very last metallization layer 340 of a metallization system 350, wherein the metal regions 340A, 340B may be embedded in corresponding interlayer dielectric material 341. Furthermore, the contact pad 310A may be connected to the metal region 340A by the via 311A, which may represent a lower portion of the metal region 310A and which may have a tapered shape so as to provide superior adhesion and mechanical stability with respect to the surrounding dielectric material 341. Similarly, the contact pad 310B may be connected to the metal region 340B on the basis of the via 311B having a tapered cross-sectional shape. Furthermore, the overlapping of the contact pads 310A, 310B with the underlying metal regions 340A, 340B may be accomplished by the respective projections, wherein, according to the section illustrated in FIG. 3A, the projection 344B of the metal region 340B may overlap with the projection 314A of the contact pad 310A.

Consequently, referring again to FIG. 3A, when moving the section line IIIB-IIIB in the downward direction of FIG. 3A, respective overlapping portions of the contact pad 310B with the metal region 340A will be obtained, and so forth. As is evident, at least within the overlapping areas of the respective contact pads and metal regions, a "vertical" path for crack propagation is substantially hampered by the overlapping configuration.

Figure 3C:
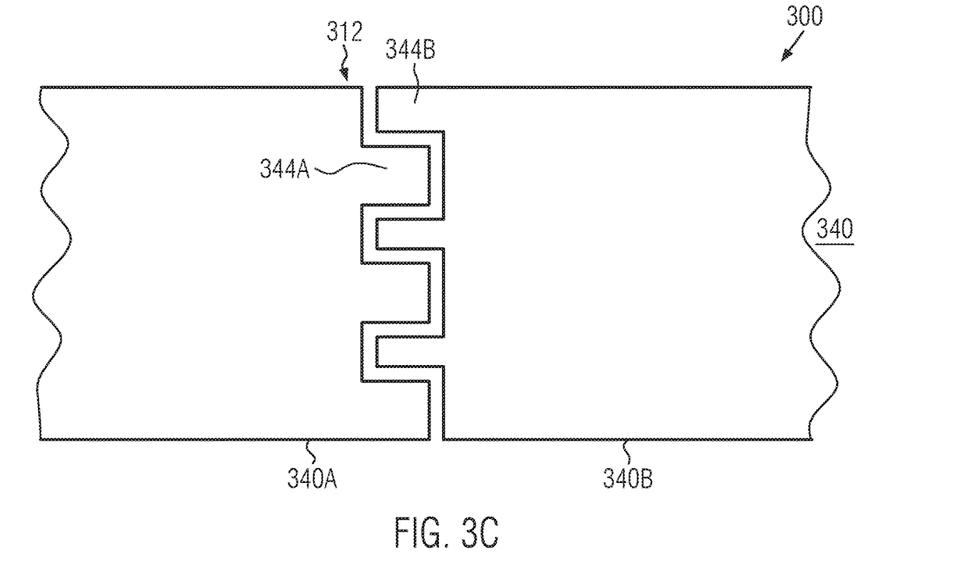
FIG. 3C schematically illustrates a top view of a design of metal regions in a last metallization layer of a semiconductor device, including edge regions facing each other and forming an interdigitating configuration on the basis of quadrangular projections, according to illustrative embodiments.

FIG. 3C schematically illustrates a top view of the semiconductor device 300 according to further illustrative embodiments, in which the metal regions 340A, 340B provided in the last metallization layer 340 may have a lateral interdigitating configuration formed on the basis of substantially quadrangular projections 344A, 344B. That is, respective laterally oppositely arranged edges 312 of the metal regions 340A, 340B have the projections 344A on the metal region 340A and the complementary arranged projections 344B on the metal region 340B, thereby obtaining a laterally interdigitating configuration that provides a high crack-suppressing behavior within the layer 340, i.e., in the vertical direction of FIG. 3C. In some illustrative embodiments, this crack-suppressing characteristic of the very last metallization layer 340 may suffice for obtaining a desired increased robustness with respect to crack formation in a corresponding interlayer dielectric material.

In further illustrative embodiments, a corresponding interdigitating configuration may also be established at least at the level of the contact pads, as will be described with reference to FIG. 3D.

Figure 3D:
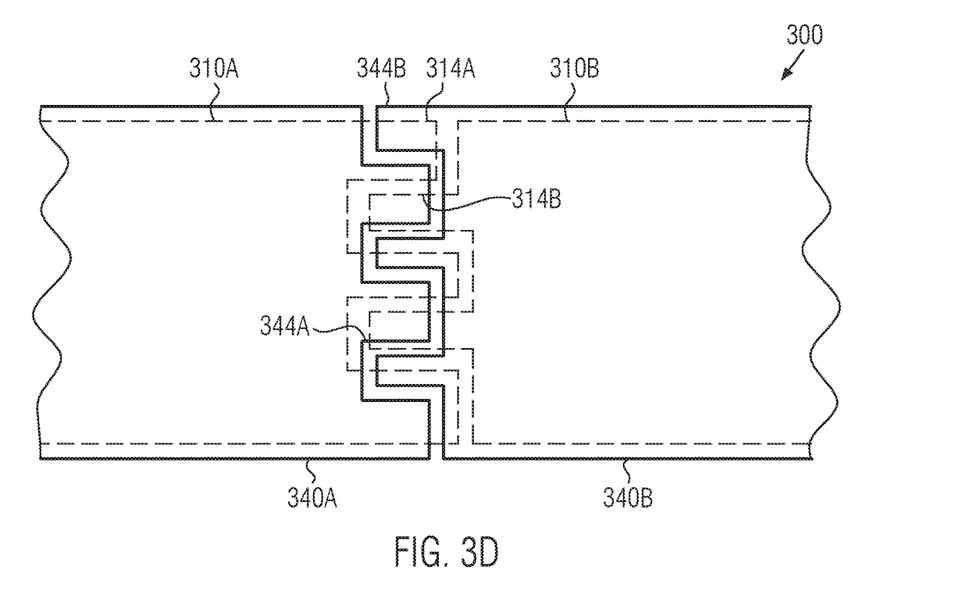
FIG. 3D schematically illustrates a design and a respective semiconductor device in top view, wherein an overlap and interdigitating configuration are obtained by using edge regions with quadrangular projections in adjacent metal regions and adjacent contact pads, according to further illustrative embodiments.

FIG. 3D schematically illustrates a top view of the semiconductor device 300 or of a design thereof, wherein the contact pads 310A, 310B may be roughly positioned above the corresponding metal regions 340A, 340B any may be connected thereto by vias or lower portions, as discussed above with reference to FIGS. 2A-2C and 3A-3B. For simplicity, any such vias are not shown in FIG. 3D. As discussed above, however, any such vias may have a lateral shape that may correspond with the lateral shape of the contact pads 310A, 310B, but with slightly reduced dimensions.

As illustrated, the contact pad 310A may have respective projections 314A, which may have a substantially quadrangular lateral shape, so as to form an interdigitating configuration with respective projections 314B of the contact pad 310B. Furthermore, the interdigitating configuration of the contact pads 310A, 310B may be considered as being "inverse" or "complementary" with respect to the interdigitating configuration formed by the metal regions 340A, 340B in that a certain overlap may be obtained, for instance, by the projection 314A of the contact pad 310A with the projection 344B of the metal region 340B, and by the projection 314B of the contact pad 310B with the projection 344A of the metal region 340A. As a consequence, as also discussed above, a highly efficient configuration may be achieved in which crack propagation in the lateral direction, i.e., the horizontal and vertical directions of FIG. 3D, and in the height direction, i.e., in the direction perpendicular to the drawing plane of FIG. 3D, may be suppressed.

Figure 3E:
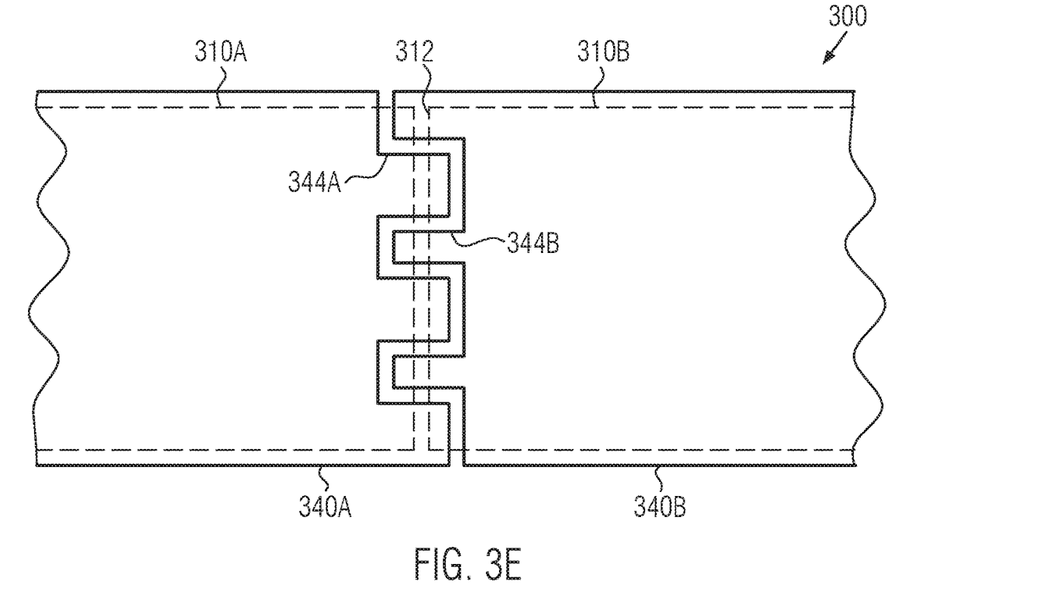
FIG. 3E schematically illustrates a top view of a design and a semiconductor device in which an interdigitating configuration of adjacent edge regions of metal regions of the last metallization layer is obtained in combination with an overlap on the basis of contact pads of substantially linear edge regions, according to further illustrative embodiments.

FIG. 3E schematically illustrates a top view of the semiconductor device 300 or the design thereof according to further illustrative embodiments in which the metal regions 340A, 340B may define an interdigitating lateral configuration, as, for instance, described above with reference to FIG. 3C. Moreover, the contact pads 310A, 310B may be provided with simplified geometric configuration at the respective oppositely arranged edges 312, which, in the embodiment shown, may represent substantially linear edge regions. The linear edge regions 312 of the contact pads 310A, 310B, however, are laterally positioned so as to provide an overlap with the corresponding adjacent metal regions 340B, 340A, respectively. That is, the contact pad 310A has its corresponding linear edge region 312 positioned so that a certain overlap is obtained with the corresponding projections 344B of the metal region 340B. Similarly, the edge region 312 of the contact pad 310B is positioned such that an overlap is established with the corresponding projections 344A of the metal region 340A. Consequently, a very efficient crack propagating suppressing behavior is also obtained in the level of the metal regions 340A, 340B on the basis of the interdigitating configuration, while crack propagation along the height direction, i.e., along a direction perpendicular to the drawing plane of FIG. 3E, is significantly suppressed due to the overlapping configuration, while, on the other hand, a substantially linear configuration of the edge regions 312 may be implemented.

Figure 3F:
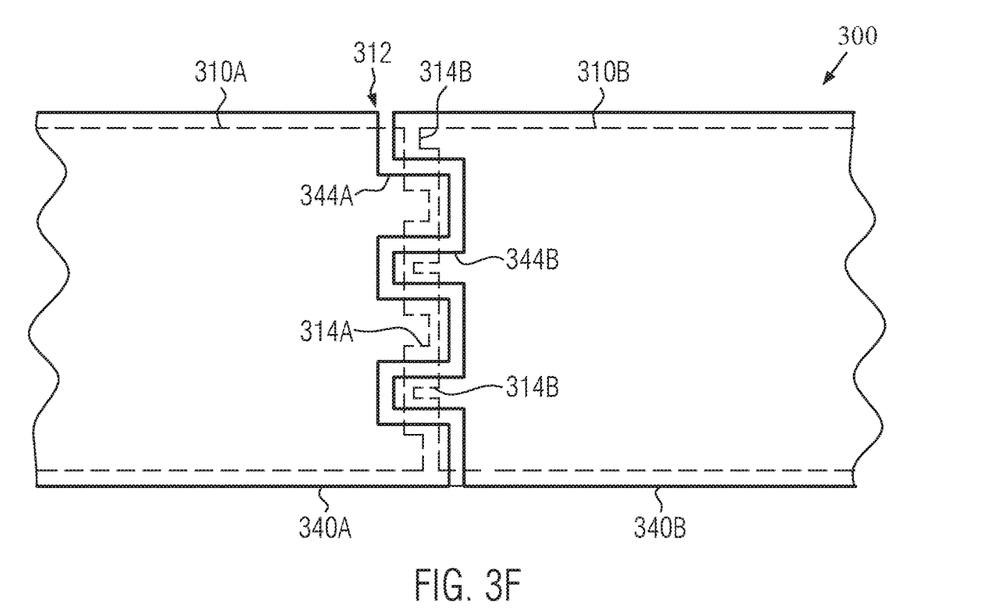
FIG. 3F schematically illustrates a top view of a design and a semiconductor device in which an interdigitating configuration is obtained in both the neighboring metal regions in the last metallization layer and the contact pads, wherein the interdigitating geometry has a substantially same progression in each pair of metal region/contact pad, according to illustrative embodiments.

FIG. 3F schematically illustrates a top view of the semiconductor device 300 or the design thereof according to further illustrative embodiments. As shown, the metal regions 340A, 340B may provide a laterally interdigitating configuration by means of respective substantially quadrangular projections 344A, 344B, respectively, as also explained above with reference to FIG. 3C. Furthermore, the contact pads 310A, 310B may form an interdigitating configuration by respective projections 314A, 314B of substantially quadrangular lateral shape. As illustrated, in this case, the projections 314A of the contact pad 310A may be formed above the corresponding projections 344A of the metal region 340A so that the projections 314A, 344A define the non-quadrangular shape at the respective edge region, wherein the corresponding projections are centered above each other. Similarly, the projections 314B of the contact pad 310B are centered above the respective projections 344B of the metal region 340B. On the other hand, the edge regions 312 are positioned such that a certain overlap is obtained, for instance, by the projections 344A with the non-projecting portions between two laterally adjacent projections 314B of the contact pad 310B. The same holds true for the projections 344B of the metal region 340B and the non-projecting areas between respective projections 314A of the contact pad 310A.

As a consequence, by generally providing a non-quadrangular lateral shape of the metal regions and/or the contact pads, a plurality of geometric configurations may be provided in which laterally oppositely arranged edges of adjacent metal regions and/or adjacent contact pads may provide non-linear lateral spaces between adjacent metal regions and/or contact pads, thereby significantly increasing the energy required for creating and, in particular, causing propagation of, a crack in lateral directions. For instance, in illustrative embodiments, a laterally interdigitating or complementary configuration of adjacent metal regions and/or adjacent contact pads may provide a pronounced resistance against crack generation and crack propagation. Furthermore, upon providing an overlap of contact pads and metal regions, a mechanically, highly robust overall configuration may also be obtained, thereby at least significantly increasing the energy required for generating a crack along the height direction of the configuration and also increasing the crack propagating suppressing behavior in the height direction. In advantageous embodiments, the highly laterally effective concepts, i.e., lateral interdigitating or complementary configuration of non-quadrangular nature in adjacent metal regions and/or contact pads, may be combined with an overlapping configuration of contact pads and metal regions, thereby providing even more superior crack suppression performance of a corresponding semiconductor device. Since the design modifications compared to purely quadrangular metal regions and contact pads may be well within the capabilities of well-established lithography techniques, the superior behavior with respect to crack resistance may be accomplished without significant modifications of any processes and materials, except for an adaptation of respective lithography masks for implementing the appropriate design in the actual semiconductor device.

Figure 4:
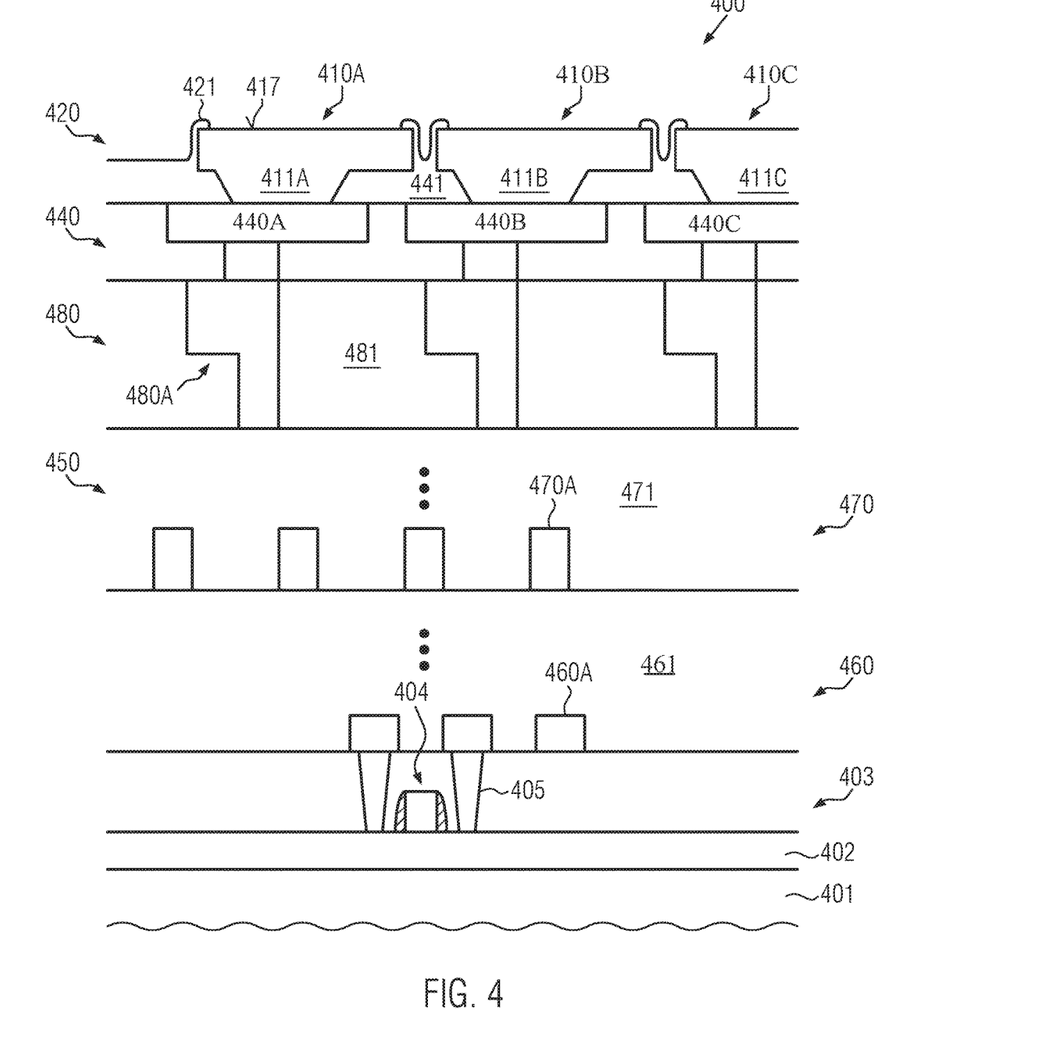
FIG. 4 schematically illustrates a cross-sectional view of a semiconductor device including a metallization system and a passivation layer including contact pads formed in accordance with design and process techniques as described above.

FIG. 4 schematically illustrates a cross-sectional view of a semiconductor device 400 having superior performance with respect to suppressing crack formation and crack propagating. As illustrated, the semiconductor device 400 may comprise a substrate 401, such as a semiconductor substrate comprising silicon, silicon/germanium or any other appropriate semiconductor material, possibly in combination with a buried dielectric material, depending on the overall configuration of the semiconductor device 400. A semiconductor layer 402 may be formed in or on the substrate 401 with appropriate material composition and characteristics so as to form therein and thereon respective circuit elements 404, such as field effect transistors, resistors and the like. The circuit elements 404 may have any appropriate critical dimensions, wherein, in sophisticated semiconductor devices, vertical dimensions of 30 nm and even less may have to be implemented in order to comply with the corresponding design rules. At least a portion of the circuit elements 404 may be embedded in a contact level 403, which may comprise any appropriate dielectric material and may include contact elements 405 comprising appropriate metal-containing materials so as to connect to respective contact areas of the circuit elements 404.

A metallization system 450 may be formed above the contact level 403 so as to connect to the respective contact elements 405 and to provide the electrical, thermal and mechanical connections required for proper functioning of the semiconductor device 400. As previously discussed, a respective metallization system, such as the system 450, may have a plurality of metallization layers, the number and complexity of which may significantly depend on the overall configuration of the semiconductor device 400. As an example, a first metallization layer 460 may be provided so as to connect to the contact level 403 and may have formed therein respective metal regions, such as metal lines 460A that are laterally embedded in an appropriate dielectric material 461. Moreover, the metallization system 450 may comprise additional metallization layers 470, 480 with respective dielectric materials 471, 481 and metal regions 470A, 480A, respectively. Irrespective of the actual number of metallization layers 460, 470, 480, a very last metallization layer 440 may be present so as to serve as an "interface" for a passivation level 420, which, in turn, may provide for passivation of the semiconductor device 400 with respect to environmental influences and the like, and which may also provide connectivity to the environment, for instance, for connecting to a package, a further semiconductor device and the like. The last metallization layer 440 may, therefore, comprise highly conductive metal regions 440A, 440B, 440C which may be appropriately connected to the next lower metallization layer 480 and which may provide electrical and thermal conductivity. To this end, any appropriate interlayer dielectric material 441 may be provided, the characteristics of which may depend on the overall requirements of the semiconductor device 400 with respect to dielectric constant and the like. In particular, the metal regions 440A, 440B, 440C may represent contact areas for connecting to respective contact pads 410A, 410B, 410C which, in turn may provide respective contact surfaces 417 that are exposed by the passivation material 421. For example, in some illustrative embodiments, the contact surface areas 417 may represent areas for receiving a bond wire in order to establish a wire bond connection to a further device, such as a package and the like. In other embodiments, the contact pads 410A, 410B, 410C may represent components used for other contact techniques, such as solder techniques, as used in flip chip approaches.

As previously discussed, typically at least the metal regions 440A, 440B, 440C of the last metallization layer 440 are formed on the basis of minimum dimensions that may be significantly less critical compared to the dimensions required in lower lying metallization layers, such as the layers 460, 470 and the like. Consequently, due to the substantially increased lateral dimensions, a non-quadrangular lateral shape of the metal regions 440A, 440B, 440C may be accomplished on the basis of well-established lithography techniques by forming respective complementary geometrical configurations, at least at neighboring edge regions, as previously discussed with reference to FIGS. 2A-2C and 3A-3F. Thus, although any such non-quadrangular lateral shapes of the metal regions 440A, 440B, 440C may require the implementation of somewhat reduced minimal lateral dimensions compared to conventional quadrangular designs, any such reduced lateral dimensions are within the capability of well-established lithography techniques.

Similarly, the contact pads 410A, 410B, 410C, which may be connected to the respective lower lying metal regions 440A, 440B, 440C by respective vias or lower portions 411A, 411B, 411C, may be formed on the basis of a lateral shape or design as discussed above. Consequently, adjacent ones of the metal regions 440A, 440B 440C may form a laterally interdigitating or complementary configuration, as discussed above. Similarly, in some illustrative embodiments, adjacent ones of the contact pads 410A, 410B, 410C may form a laterally interdigitating configuration by providing a non-quadrangular configuration. In further embodiments, in addition to or alternatively, the contact pads 410A, 410B, 410C may form an overlap with underlying and laterally adjacent metal regions based on a non-quadrangular or quadrangular lateral shape. For example, as shown in FIG. 4, the contact pad 410A may overlap with the metal region 440B and the contact pad 410B may overlap with the metal region 440C, and so forth, depending on the number of adjacent metal regions and contact pads. Thus, any of the above-described lateral and vertical configurations may be implemented in the last metallization layer 440 and the passivation level 420.

Furthermore, in the embodiment illustrated in FIGS. 2A-2C and 3A-3F, a lateral neighborhood of metal regions and contact pads is illustrated in one dimension only, which, for instance, may be appropriate for providing wire bond contact pads, while, in other illustrative embodiments (not shown), a corresponding neighborhood may also be established in a second lateral direction, thereby providing the respective complementary or interdigitating configuration and/or overlapping configuration along two different lateral directions, which, for instance, may be required for more complex contact regimes, such as flip chip bonding and the like.

The semiconductor device 400 as shown in FIG. 4 may be formed on the basis of the following processes.

After providing the substrate 401, the semiconductor material 402 may be formed or modified in accordance with device requirements. The circuit elements 404 may be formed on the basis of well-established process techniques, including sophisticated lithography processes for forming, for instance, gate electrode structures of field effect transistors and the like. Furthermore, epitaxial growth techniques, ion implantation, sophisticated etch techniques and the like may be applied so as to finally obtain the circuit elements 404. Thereafter, the contact level 403 may be formed by depositing any appropriate dielectric material(s), planarizing the same and forming openings, followed by the deposition of one or more appropriate conductive materials so as to obtain the contact elements 405. Next, the metallization system 450 may be formed layer by layer, for instance, by depositing any appropriate dielectric material, such as silicon dioxide, hydrogen-enriched silicon dioxide or any other low-k dielectric material, if required, which may then be patterned so as to form trenches and via openings, which may be subsequently filled with appropriate material, such as copper, copper alloys and the like. During the process sequence for forming the metallization system 450, the last metallization layer 440 may also be formed by providing the dielectric material 441 and patterning the same on the basis of lithography masks that include appropriately designed lateral structures as, for instance, discussed above with reference to FIGS. 2A-2C and 3A-3F. Consequently, during the respective lithography processes and the subsequent patterning sequences, appropriate non-quadrangular lateral shapes may be achieved for the metal regions 440A, 440B, 440C. Thereafter, the further dielectric material, also denoted by reference numeral 441, may be deposited and patterned so as to form the vias 411A, 411B, 411C, possibly together with the contact pads 410A, 410B, 410C on the basis of appropriate lithography techniques for patterning the dielectric material 441, wherein, also in this case, the same criteria apply as discussed with respect to the regions 440A, 440B, 440C. That is, depending on whether a lateral interdigitating configuration is to be established and/or whether an appropriate overlap at certain areas with the corresponding underlying metal regions 440A, 440B, 440C is to be implemented, a respective design may be transferred into the material 441 and possibly a further mask layer (not shown) during the respective lithography process. Thereafter, any appropriate material, such as aluminum, may be deposited, for instance, by plating techniques, followed by the deposition of the passivation material 421 and the corresponding patterning thereof so as to expose the contact surfaces 417.

As a result, the present disclosure provides semiconductor devices and respective manufacturing techniques in which specific non-quadrangular lateral shapes, i.e., designs, may be implemented for the metal regions of the very last metallization layer and/or for the contact pads connected to the metal regions in the last metallization layer in order to reduce the probability of crack propagation in the lateral and/or height directions of the semiconductor device. It is believed that the modified lateral and vertical configuration, i.e., interdigitating configuration and overlap, may increase the critical energy level that may be required for generating a crack or for causing propagation of the crack laterally and vertically.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
    a metallization system including a last metallization layer, said last metallization layer comprising a first metal region and a second metal region laterally separated from and adjacent to said first metal region;
    a passivation layer formed above said last metallization layer;
    a first contact pad formed in said passivation layer so as to be in contact with said first metal region, wherein said first contact pad overlaps a portion of said second metal region in a height direction perpendicular to an upper surface of said first contact pad, and
    a second contact pad formed in said passivation layer adjacent to said first contact pad so as to be in contact with said second metal region and overlap a portion of said first metal region in a height direction perpendicular to an upper surface of said second contact pad.

2. The semiconductor device of claim 1, wherein at least one of said first and second metal regions has a non-quadrangular lateral shape taken from a top view.

3. The semiconductor device of claim 2, wherein said non-quadrangular lateral shape of said at least one of said first and second metal regions is defined by an edge of said at least one of said first metal region and said second metal region that faces an edge of the other one of said at least one of said first metal region and said second metal region.

4. The semiconductor device of claim 2, wherein each of said first and second metal regions has a non-quadrangular lateral shape.

5. The semiconductor device of claim 4, wherein opposite edges of said first and second metal regions have complementary lateral shapes so as to form an interdigitating lateral configuration.

6. The semiconductor device of claim 1, wherein at least one of said first and second contact pads has a non-quadrangular shape taken from a top view.

7. The semiconductor device of claim 6, wherein said non-quadrangular lateral shape of said at least one of said first and second contact pads is defined by an edge of said at least one of said first contact pad and said second contact pad that faces an edge of the other one of said at least one of said first contact pad and said second contact pad.

8. The semiconductor device of claim 6, wherein each of said first and second contact pads has a non-quadrangular lateral shape.

9. The semiconductor device of claim 8, wherein opposite edges of said first and second contact pads have complementary lateral shapes so as to form an interdigitating lateral configuration.

10. The semiconductor device of claim 1, wherein at least one of said first and second metal regions has a non-quadrangular lateral shape taken from a top view and at least one of said first and second contact pads has a non-quadrangular lateral shape taken from said top view.

11. The semiconductor device of claim 2, wherein said non-quadrangular lateral shape of said at least one of said first and second metal regions is formed by two or more substantially quadrangular projections formed at an edge region of said at least one of said first and second metal regions.

12. The semiconductor device of claim 2, wherein said non-quadrangular lateral shape of said at least one of said first and second metal regions is formed by two or more substantially triangular projections formed at an edge region of said at least one of said first and second metal regions.

13. The semiconductor device of claim 6, wherein said non-quadrangular lateral shape of said at least one of said first and second contact pads is formed by two or more substantially quadrangular projections formed at an edge region of said at least one of said first and second contact pads.

14. The semiconductor device of claim 6, wherein said non-quadrangular lateral shape of said at least one of said first and second contact pads is formed by two or more substantially triangular projections formed at an edge region of said at least one of said first and second contact pads.

15. A method, comprising:
    forming a metallization system including a last metallization layer, said last metallization layer comprising a first metal region and a second metal region laterally separated from and adjacent to said first metal region;

forming a passivation layer formed above said last metallization layer;

forming a first contact pad in said passivation layer so as to be in contact with said first metal region, wherein said first contact pad overlaps a portion of said second metal region in a height direction perpendicular to an upper surface of said first contact pad, and forming a second contact pad in said passivation layer adjacent to said first contact pad so as to be in contact with said second metal region and overlap a portion of said first metal region in a height direction perpendicular to an upper surface of said second contact pad.

16. The method of claim 15, wherein each of said first and second metal regions has a non-quadrangular lateral shape taken from a top view.

17. The method of claim 16, wherein said non-quadrangular lateral shape of each of said first and second metal regions is formed by two or more substantially quadrangular projections formed at an edge region of each of said first and second metal regions.

18. The method of claim 16, wherein said non-quadrangular lateral shape of each of said first and second metal regions is formed by two or more substantially triangular projections formed at an edge region of each of said first and second metal regions.

19. The method of claim 15, wherein each of said first and second contact pads has a non-quadrangular lateral shape taken from a top view.

20. The method of claim 19, wherein said non-quadrangular lateral shape of said at least one of said first and second contact pads is formed by two or more substantially quadrangular projections formed at an edge region of said at least one of said first and second contact pads.

* * * * *